United States Patent
Takenaga et al.

(10) Patent No.: US 8,354,135 B2
(45) Date of Patent: Jan. 15, 2013

(54) THERMAL PROCESSING APPARATUS, METHOD FOR REGULATING TEMPERATURE OF THERMAL PROCESSING APPARATUS, AND PROGRAM

(75) Inventors: Yuichi Takenaga, Nirasaki (JP); Wenling Wang, Nirasaki (JP); Tatsuya Yamaguchi, Nirasaki (JP); Masahiko Kaminishi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 501 days.

(21) Appl. No.: 12/394,288

(22) Filed: Feb. 27, 2009

(65) Prior Publication Data

US 2009/0232967 A1 Sep. 17, 2009

(30) Foreign Application Priority Data

| Mar. 17, 2008 | (JP) | 2008-067754 |
| Mar. 17, 2008 | (JP) | 2008-067755 |
| Jan. 21, 2009 | (JP) | 2009-011383 |
| Jan. 21, 2009 | (JP) | 2009-011384 |

(51) Int. Cl.
*C23C 16/52* (2006.01)
*C23C 16/00* (2006.01)

(52) U.S. Cl. .................................. 427/8; 427/248.1
(58) Field of Classification Search ............ 427/8, 248.1
See application file for complete search history.

(56) References Cited

U.S. PATENT DOCUMENTS

| 6,787,377 B2 * | 9/2004 | Wang et al. ............. 438/14 |
| 2001/0049080 A1 | 12/2001 | Asano et al. |
| 2007/0074660 A1 | 4/2007 | Park et al. |

FOREIGN PATENT DOCUMENTS

| JP | 2002-043300 | | 2/2002 |
| JP | 2003-209099 | * | 7/2003 |
| JP | 2007-081365 | | 3/2007 |
| KR | 2006-0114284 | | 11/2006 |
| KR | 2007-0074539 | | 7/2007 |

OTHER PUBLICATIONS

Korean Office Action issued in KR 10-2009-21953, mailed Sep. 22, 2011 (with English translation).

* cited by examiner

*Primary Examiner* — Kelly M Gambetta
(74) *Attorney, Agent, or Firm* — Smith, Gambrell & Russell, LLP

(57) ABSTRACT

There are provided a thermal processing apparatus, a method for regulating a temperature of a thermal processing apparatus, and a program, by which a temperature can be easily regulated. A control part 50 of a thermal processing apparatus 1 controls the apparatus so as to deposit $SiO_2$ films on semiconductor wafers W, and judges whether the $SiO_2$ films satisfy an in-plane uniformity. When the in-plane uniformity is not judged to be satisfied, the control part 50 calculates a temperature of a preheating part 23 by which temperature the in-plane uniformity can be satisfied. The control part 50 controls the apparatus so as to deposit $SiO_2$ films on semiconductor wafers W under process conditions in which the temperature of the preheating part 23 has been varied into the calculated temperature, and the temperature of the preheating parts 23 is regulated. When the in-plane uniformity is judged to be satisfied, the control part 50 regulates temperatures of heaters 11 to 15 by the same procedure so as to satisfy an inter-plane uniformity.

8 Claims, 16 Drawing Sheets

| SEMICONDUCTOR WAFER | | TEMPERATURE OF PREHEATING PART(°C) | | | |
|---|---|---|---|---|---|
| | | 400 | 500 | 600 | 700 |
| ZONE1 Slot11 | Ctr | 0.003 | 0.004 | 0.004 | 0.004 |
| | Edge | 0.003 | 0.004 | 0.004 | 0.005 |
| ZONE2 Slot37 | Ctr | 0.004 | 0.005 | 0.006 | 0.006 |
| | Edge | 0.004 | 0.006 | 0.006 | 0.007 |
| ZONE3 Slot63 | Ctr | 0.005 | 0.007 | 0.008 | 0.008 |
| | Edge | 0.006 | 0.008 | 0.009 | 0.009 |
| ZONE4 Slot89 | Ctr | 0.008 | 0.010 | 0.011 | 0.012 |
| | Edge | 0.009 | 0.012 | 0.013 | 0.014 |
| ZONE5 Slot115 | Ctr | 0.012 | 0.016 | 0.018 | 0.019 |
| | Edge | 0.014 | 0.019 | 0.021 | 0.022 |

TEMPERATURE(°C)

| HEATER | | | | | PRE-HEATING PART |
|---|---|---|---|---|---|
| HEATER 11 | HEATER 12 | HEATER 13 | HEATER 14 | HEATER 15 | |
| 776 | 785 | 780 | 760 | 730 | 760 |

(b)

FLOW RATE(sccm)

| $SiH_2Cl_2$ | $N_2O$ |
|---|---|
| 100 | 200 |

(c)

PRESSURE, PROCESS PERIOD

| PRESSURE(Pa) | 400 |
|---|---|
| PROCESS PERIOD(min) | 22.5 |

FIG. 6

| MEASURED POSITION IN PLANE | | SLOT TO WHICH MONITOR WAFER IS TRANSFERRED | | | | |
|---|---|---|---|---|---|---|
| X | Y | 11 | 37 | 63 | 89 | 115 |
| 0.0 | 0.0 | 4.71 | 4.93 | 4.82 | 4.81 | 4.72 |
| 98.0 | 0.0 | 4.80 | 4.99 | 4.88 | 4.88 | 4.97 |
| 0.0 | 98.0 | 4.81 | 5.00 | 4.91 | 4.93 | 5.01 |
| -98.0 | 0.0 | 4.79 | 4.99 | 4.91 | 4.92 | 5.02 |
| 0.0 | -98.0 | 4.79 | 4.97 | 4.87 | 4.86 | 4.99 |
| 103.9 | 103.9 | 5.10 | 5.25 | 5.16 | 5.19 | 5.48 |
| -103.9 | 103.9 | 5.12 | 5.26 | 5.19 | 5.24 | 5.53 |
| -103.9 | -103.9 | 5.11 | 5.22 | 5.16 | 5.19 | 5.55 |
| 103.9 | -103.9 | 5.10 | 5.21 | 5.12 | 5.12 | 5.45 |
| (mm) | | | | | | (nm) |

FIG. 7

| | SLOT TO WHICH MONITOR WAFER IS TRANSFERRED | | | | |
|---|---|---|---|---|---|
| | 11 | 37 | 63 | 89 | 115 |
| Ctr FILM THICKNESS | 4.63 | 4.86 | 4.75 | 4.74 | 4.66 |
| Edge FILM THICKNESS | 5.09 | 5.22 | 5.14 | 5.17 | 5.49 |

(a) TEMPERATURE OF PREHEATING PART:760°C

| | | FILM THICKNESS | IN-PLANE FILM THICKNESS DIFFERENCE |
|---|---|---|---|
| Slot11 | Ctr | 4.63 | 0.46 |
| | Edge | 5.09 | |
| Slot37 | Ctr | 4.86 | 0.36 |
| | Edge | 5.22 | |
| Slot63 | Ctr | 4.75 | 0.39 |
| | Edge | 5.14 | |
| Slot89 | Ctr | 4.74 | 0.43 |
| | Edge | 5.17 | |
| Slot115 | Ctr | 4.66 | 0.83 |
| | Edge | 5.49 | |

(nm)

(b) TEMPERATURE OF PREHEATING PART:650°C

| ESTIMATED FILM THICKNESS | ESTIMATED IN-PLANE FILM THICKNESS DIFFERENCE |
|---|---|
| 4.19 | 0.35 |
| 4.54 | |
| 4.20 | 0.25 |
| 4.45 | |
| 3.87 | 0.28 |
| 4.15 | |
| 3.42 | 0.21 |
| 3.63 | |
| 2.57 | 0.50 |
| 3.07 | |

|  |  | FILM THICKNESS | AVERAGE | DIFFERENCE BETWEEN CURRENT AND TARGET FILM THICKNESSES | TEMPERATURE VARIATION AMOUNT | ESTIMATED FILM THICKNESS |
|---|---|---|---|---|---|---|
| Slot11 | Ctr | 4.19 | 4.37 | 0.64 | 6.4 | 5.00 |
|  | Edge | 4.54 |  |  |  |  |
| Slot37 | Ctr | 4.20 | 4.33 | 0.68 | 6.8 | 5.00 |
|  | Edge | 4.45 |  |  |  |  |
| Slot63 | Ctr | 3.87 | 4.01 | 0.99 | 9.9 | 5.00 |
|  | Edge | 4.15 |  |  |  |  |
| Slot89 | Ctr | 3.42 | 3.53 | 1.48 | 14.8 | 5.00 |
|  | Edge | 3.63 |  |  |  |  |
| Slot115 | Ctr | 2.57 | 2.82 | 2.18 | 21.8 | 5.00 |
|  | Edge | 3.07 |  |  |  |  |
|  |  |  |  | (nm) | (°C) | (nm) |

FIG. 11

| HEATER | | | | | PREHEATING PART |
|---|---|---|---|---|---|
| HEATER11 | HEATER12 | HEATER13 | HEATER14 | HEATER15 | |
| 776 | 785 | 780 | 760 | 730 | 760 |

| HEATER | | | | | PREHEATING PART |
|---|---|---|---|---|---|
| HEATER11 | HEATER12 | HEATER13 | HEATER14 | HEATER15 | |
| 782.4 | 791.8 | 789.9 | 774.8 | 751.8 | 650 |

| | TEMPERATURE OF PREHEATING PART 29a(°C) | | | |
|---|---|---|---|---|
| SEMICONDUCTOR WAFER | 400 | 500 | 600 | 700 |
| ZONE1 Slot11 Ctr | 0.003 | 0.004 | 0.004 | 0.004 |
| ZONE1 Slot11 Edge | 0.003 | 0.004 | 0.004 | 0.005 |
| ZONE2 Slot37 Ctr | 0.004 | 0.005 | 0.006 | 0.006 |
| ZONE2 Slot37 Edge | 0.004 | 0.006 | 0.006 | 0.007 |
| ZONE3 Slot63 Ctr | 0.005 | 0.007 | 0.008 | 0.008 |
| ZONE3 Slot63 Edge | 0.006 | 0.008 | 0.009 | 0.009 |
| ZONE4 Slot89 Ctr | 0.008 | 0.010 | 0.011 | 0.012 |
| ZONE4 Slot89 Edge | 0.009 | 0.012 | 0.013 | 0.014 |
| ZONE5 Slot115 Ctr | 0.012 | 0.016 | 0.018 | 0.019 |
| ZONE5 Slot115 Edge | 0.014 | 0.019 | 0.021 | 0.022 |

(Stacked headers above: TEMPERATURE OF PREHEATING PART 27a(°C), TEMPERATURE OF PREHEATING PART 28a(°C), TEMPERATURE OF PREHEATING PART 29a(°C))

| TEMPERATURE(°C) | HEATER | | | | | PREHEATING PART | | | |
|---|---|---|---|---|---|---|---|---|---|
| | HEATER 11 | HEATER 12 | HEATER 13 | HEATER 14 | HEATER 15 | PREHEATING PART 27a | PREHEATING PART 28a | PREHEATING PART 29a |
| | 780 | 780 | 780 | 780 | 780 | 700 | 700 | 700 |

(b)

| FLOW RATE(sccm) | SiH$_2$Cl$_2$ | N$_2$O |
|---|---|---|
| | 100 | 200 |

(c)

| PRESSURE, PROCESS PERIOD | PRESSURE(Pa) | PROCESS PERIOD(min) |
|---|---|---|
| | 400 | 22.5 |

| MEASURED POSITION IN PLANE | | SLOT TO WHICH MONITOR WAFER IS TRANSFERRED | | | | |
|---|---|---|---|---|---|---|
| X | Y | 11 | 37 | 63 | 89 | 115 |
| 0.0 | 0.0 | 5.04 | 4.95 | 4.52 | 3.90 | 2.76 |
| 98.0 | 0.0 | 5.09 | 4.98 | 4.53 | 3.91 | 2.83 |
| 0.0 | 98.0 | 5.08 | 4.96 | 4.50 | 3.86 | 2.80 |
| -98.0 | 0.0 | 5.09 | 4.98 | 4.54 | 3.91 | 2.86 |
| 0.0 | -98.0 | 5.11 | 5.00 | 4.55 | 3.93 | 2.86 |
| 103.9 | 103.9 | 5.36 | 5.12 | 4.66 | 3.97 | 2.96 |
| -103.9 | 103.9 | 5.36 | 5.15 | 4.65 | 3.95 | 2.97 |
| -103.9 | -103.9 | 5.38 | 5.18 | 4.73 | 4.07 | 3.06 |
| 103.9 | -103.9 | 5.38 | 5.17 | 4.71 | 4.04 | 3.01 |
| (mm) | | | | | | (nm) |

FIG. 17

|  | SLOT TO WHICH MONITOR WAFER IS TRANSFERRED | | | | |
| --- | --- | --- | --- | --- | --- |
|  | 11 | 37 | 63 | 89 | 115 |
| Ctr FILM THICKNESS | 4.97 | 4.92 | 4.48 | 3.87 | 2.73 |
| Edge FILM THICKNESS | 5.33 | 5.13 | 4.66 | 4.00 | 2.99 |

THERMAL PROCESSING APPARATUS, METHOD FOR REGULATING TEMPERATURE OF THERMAL PROCESSING APPARATUS, AND PROGRAM

CROSS REFERENCE TO RELATED APPLICATIONS

This application is based upon and claims the benefit of priority from the prior Japanese Patent Application Nos. 2008-67754 filed on Mar. 17, 2008, 2008-67755 filed on Mar. 17, 2008, 2009-11383 filed on Jan. 21, 2009, and 2009-11384 filed on Jan. 21, 2009, the entire contents of which are incorporated herein by reference.

FIELD OF THE INVENTION

The present invention relates to a thermal processing apparatus configured to thermally process an object to be processed such as a semiconductor wafer, a method for regulating a temperature of a thermal processing apparatus, and a program.

BACKGROUND ART

In a manufacturing step of a semiconductor device, there has been used a thermal processing apparatus for performing a film deposition process etc. to an object to be processed, e.g., a semiconductor wafer. In the thermal processing apparatus, there are prepared recipes in which process conditions such as process temperatures, process pressures, and gas flow rates are written in accordance with types of a film to be deposited and film thicknesses. By selecting one of these recipes, there is performed a thermal process based on the predetermined process conditions.

Even when a thermal process is performed based on the predetermined process conditions, there is a possibility that a film deposition gas might not be sufficiently activated, because a temperature of the film deposition gas tends to be lowered in an area near to a nozzle from which the film deposition gas is supplied. If the film deposition gas is not sufficiently activated, a film is not properly deposited on a semiconductor wafer, which may impair a film thickness uniformity of the film formed on the semiconductor wafer, for example.

In order to solve this problem, Patent Document 1 proposes a film deposition method and a film deposition apparatus that can improve a film thickness uniformity of a film to be formed on a semiconductor wafer, by preheating a film deposition gas with a preheating apparatus immediately before the film deposition gas is supplied into a processing vessel.

[Patent Document 1] JP2003-209099A

However, even when a thermal process is performed based on predetermined process conditions with the use of such an apparatus, there is a possibility that a film thickness uniformity of a film to be formed on a semiconductor wafer might be impaired depending on an individual difference between apparatuses and a type of a semiconductor wafer to be processed. Thus, an operator of the apparatus regulates temperatures of a heater and a preheating apparatus based on the experience and the sense, so as to achieve a film thickness uniformity of a film to be deposited on a surface of a semiconductor wafer.

Namely, in a film deposition process, it is difficult for an operator, who is inexperienced in a thermal processing apparatus and a thermal process, to achieve a film thickness of a film to be formed on a semiconductor wafer. Thus, there has been required a thermal processing apparatus whose temperature can be easily regulated even by an unskilled operator, so that a film thickness uniformity of a film to be formed on a semiconductor wafer can be achieved.

DISCLOSURE OF THE INVENTION

The present invention has been made in view of the above circumstances, and the object of the present invention is to provide a thermal processing apparatus whose temperature can be easily regulated, a method for regulating a temperature of a thermal processing apparatus, and a program.

The present invention is a thermal processing apparatus comprising: a process chamber capable of accommodating a plurality of objects to be processed; a heating unit configured to heat an inside of the process chamber; a process-gas supply unit configured to supply a process gas into the process chamber; a preheating unit configured to heat the process gas supplied from the process-gas supply unit, before the process gas is supplied into the process chamber; a process-condition storage unit that stores process conditions in accordance with a process content, the process conditions including a temperature of the inside within the process chamber heated by the heating unit, a temperature of the process gas heated by the preheating unit, an in-plane uniformity of the process, and an inter-plane uniformity of the process; a processing unit configured to process the objects to be processed under the process conditions stored in the process-condition storage unit; a process-gas temperature regulating unit configured to: judge whether a result of the process performed by the processing unit satisfies the in-plane uniformity of the process stored in the process-condition storage unit; calculate a temperature of the process gas heated by the preheating unit, by which temperature the in-plane uniformity can be satisfied, when the in-plane uniformity is not judged to be satisfied; vary the temperature of the process gas heated by the preheating unit, which is included in the process conditions stored in the process-condition storage unit, into the calculated temperature of the process gas; and to regulate the temperature of the process gas such that the objects to be processed are processed under the varied process conditions; and a process-chamber temperature regulating unit configured to: judge whether a result of the process performed by the processing unit satisfies the inter-plane uniformity of the process stored in the process-condition storage unit; calculate a temperature of the process chamber heated by the heating unit, by which temperature the inter-plane uniformity can be satisfied, when the inter-plane uniformity is not judged to be satisfied; and to regulate the temperature of the process chamber such that the objects to be processed are processed under process conditions in which the temperature of the process chamber heated by the heating unit, which is included in the process conditions stored in the process-condition storage unit, has been varied into the calculated temperature of the process chamber.

The present invention is the thermal processing apparatus wherein when the temperature of the process gas is regulated by the process-gas temperature regulating unit, the process-chamber temperature regulating unit judges whether the temperature of the process gas satisfies the inter-plane uniformity of the process, based on a result of the process performed by the processing unit under the process conditions in which the temperature of the process gas has been regulated.

The present invention is the thermal processing apparatus wherein the process content is a film deposition process.

The present invention is the thermal processing apparatus wherein: the process chamber is divided into a plurality of zones; and the heating unit is capable of individually setting temperatures of the respective zones in the process chamber.

The present invention is a method for regulating a temperature of a thermal processing apparatus including: a process chamber capable of accommodating a plurality of objects to be processed; a heating unit configured to heat an inside of the process chamber; a process-gas supply unit configured to supply a process gas into the process chamber; a preheating unit configured to heat a process gas supplied from the process-gas supply unit, before the process gas is supplied into the process chamber; a process-condition storage unit that stores process conditions in accordance with a process content, the process conditions including a temperature of the inside within the process chamber heated by the heating unit, a temperature of the process gas heated by the preheating unit, an in-plane uniformity of the process, and an inter-plane uniformity of the process; and a processing unit configured to process the objects to be processed under the process conditions stored in the process-condition storage unit; the method comprising: a process-gas temperature regulating step including: a step in which it is judged whether a result of the process performed by the processing unit satisfies the in-plane uniformity of the process stored in the process-condition storage unit; and a step in which, when the in-plane uniformity is not judged to be satisfied, a temperature of the process gas heated by the preheating unit, by which temperature the in-plane uniformity can be satisfied is calculated, the temperature of the process gas heated by the preheating unit, which is included in the process conditions stored in the process-condition storage unit is varied, into the calculated temperature of the process gas, and the temperature of the process gas is regulated such that the objects to be processed are processed under the varied process conditions; and a process-chamber temperature regulating step including: a step in which it is judged whether a result of the process performed by the processing unit satisfies the inter-plane uniformity of the process stored in the process-condition storage unit; and a step in which, when the inter-plane uniformity is not judged to be satisfied, a temperature of the process chamber heated by the heating unit, by which temperature the inter-plane uniformity can be satisfied is calculated, and the temperature of the process chamber is regulated such that the objects to be processed are processed under process conditions in which the temperature of the process chamber heated by the heating unit, which is included in the process conditions stored in the process-condition storage unit, has been varied into the calculated temperature of the process chamber; wherein one of the process-gas temperature regulating step and the process-chamber temperature regulating step is performed after the other of the process-gas temperature regulating step and the process-chamber temperature regulating step has been performed.

The present invention is the method for regulating a temperature of a thermal processing apparatus wherein after the process-gas temperature regulating step has been performed, the process-chamber temperature regulating step is performed.

The present invention is the method for regulating a temperature of a thermal processing apparatus wherein the process content is a film deposition process.

The present invention is the method for regulating a temperature of a thermal processing apparatus wherein the process chamber is divided into a plurality of zones; and the heating unit is capable of individually setting temperatures of the respective zones in the process chamber.

The present invention is a computer program executable in a computer to perform a method for regulating a temperature of a thermal processing apparatus including: a process chamber capable of accommodating a plurality of objects to be processed; a heating unit configured to heat an inside of the process chamber; a process-gas supply unit configured to supply a process gas into the process chamber; a preheating unit configured to heat a process gas supplied from the process-gas supply unit, before the process gas is supplied into the process chamber; a process-condition storage unit that stores process conditions in accordance with a process content, the process conditions including a temperature of the inside within the process chamber heated by the heating unit, a temperature of the process gas heated by the preheating unit, an in-plane uniformity of the process, and an inter-plane uniformity of the process; and a processing unit configured to process the objects to be processed under the process conditions stored in the process-condition storage unit; the method comprising: a process-gas temperature regulating step including: a step in which it is judged whether a result of the process performed by the processing unit satisfies the in-plane uniformity of the process stored in the process-condition storage unit; and a step in which, when the in-plane uniformity is not judged to be satisfied, a temperature of the process gas heated by the preheating unit, by which temperature the in-plane uniformity can be satisfied is calculated, the temperature of the process gas heated by the preheating unit, which is included in the process conditions stored in the process-condition storage unit is varied, into the calculated temperature of the process gas, and the temperature of the process gas is regulated such that the objects to be processed are processed under the varied process conditions; and a process-chamber temperature regulating step including: a step in which it is judged whether a result of the process performed by the processing unit satisfies the inter-plane uniformity of the process stored in the process-condition storage unit; and a step in which, when the inter-plane uniformity is not judged to be satisfied, a temperature of the process chamber heated by the heating unit, by which temperature the inter-plane uniformity can be satisfied is calculated, and the temperature of the process chamber is regulated such that the objects to be processed are processed under process conditions in which the temperature of the process chamber heated by the heating unit, which is included in the process conditions stored in the process-condition storage unit, has been varied into the calculated temperature of the process chamber; wherein one of the process-gas temperature regulating step and the process-chamber temperature regulating step is performed after the other of the process-gas temperature regulating step and the process-chamber temperature regulating step has been performed.

The present invention is a thermal processing apparatus comprising: a process chamber capable of accommodating a plurality of objects to be processed; a heating unit configured to heat an inside of the process chamber; a plurality of process-gas supply units configured to supply process gases into the process chamber; a plurality of preheating units respectively disposed on the process-gas supply units, the preheating units being configured to heat the process gases supplied from the process-gas supply units, before the process gases are supplied into the process chamber; a process-condition storage unit that stores process conditions in accordance with a process content, the process conditions including a temperature of the inside within the process chamber heated by the heating unit, respective temperatures of the process gases heated by the preheating units, an in-plane uniformity of the process, and an inter-plane uniformity of the process; a processing unit configured to process the objects to be processed under the process conditions stored in the process-condition storage unit; and a process-gas temperature regulating unit configured to: judge whether a result of the process performed by the processing unit satisfies the in-plane uniformity of the process and the inter-plane uniformity of the process stored in the process-condition storage unit; calculate respective temperatures of the process gases heated by the preheating units, by which temperatures the in-plane uniformity and the inter-plane uniformity can be satisfied, when at least one of the in-plane uniformity and the inter-plane uniformity is not judged to be satisfied; vary the respective temperatures of the process gases heated by the preheating units, which are included in the process conditions stored in the process-condition storage unit, into the calculated temperatures of the process gases; and to regulate the temperatures of the process gases such that the objects to be processed are processed under the varied process conditions.

The present invention is the thermal processing apparatus wherein the process content is a film deposition process.

The present invention is the thermal processing apparatus wherein: the process conditions stored in the process-condition storage unit include an average film thickness of deposited films on the objects to be processed; when it is judged that a result of the process performed by the processing unit does not satisfy the condition for the average film thickness, the process-gas temperature regulating unit calculates respective temperatures of the process gases heated by the preheating units, by which temperatures the conditions for the in-plane uniformity, the inter-plane uniformity, and the average film thickness can be satisfied, varies the respective temperatures of the process gases heated by the preheating units, which are included in the process conditions stored in the process-condition storage unit, into the calculated temperatures of the process gases, and regulates the temperatures of the process gases such that the objects to be processed are processed under the varied process conditions.

The present invention is the thermal processing apparatus wherein: the process chamber is divided into a plurality of zones; and the heating unit is capable of individually setting temperatures of the respective zones in the process chamber.

The present invention is a method for regulating a temperature of a thermal processing apparatus including: a process chamber capable of accommodating a plurality of objects to be processed; a heating unit configured to heat an inside of the process chamber; a plurality of process-gas supply units configured to supply process gases into the process chamber; a plurality of preheating units respectively disposed on the process-gas supply units, the preheating units being configured to heat the process gases supplied from the process-gas supply units, before the process gases are supplied into the process chamber; a process-condition storage unit that stores process conditions in accordance with a process content, the process conditions including a temperature of the process chamber heated by the heating unit, respective temperatures of the process gases heated by the preheating units, an in-plane uniformity of the process, and an inter-plane uniformity of the process; and a processing unit configured to process the objects to be processed under the process conditions stored in the process-condition storage unit; the method comprising: a judging step in which it is judged whether a result of the process performed by the processing unit satisfies the in-plane uniformity of the process and the inter-plane uniformity of the process; and a process-gas temperature regulating step in which, when at least one of the in-plane uniformity and the inter-plane uniformity is not judged to be satisfied, respective temperatures of the process gases heated by the preheating units, by which temperatures the in-plane uniformity and the inter-plane uniformity can be satisfied are calculated, the temperatures of the process gases heated by the preheating units, which are included in the process conditions stored in the process-condition storage unit, are respectively varied into the calculated temperatures of the process gases, and the temperatures of the process gases are regulated such that the objects to be processed are processed under the varied process conditions.

The present invention is the method for regulating a temperature of a thermal processing apparatus wherein the process content is a film deposition process.

The present invention is the method for regulating a temperature of a thermal processing apparatus wherein: the process conditions stored in the process-condition storage unit include an average film thickness of deposited films on the objects to be processed; in the judging step, it is further judged whether the result of the process performed by the processing unit satisfies the condition for the average film thickness; in the process-gas temperature regulating step, when the condition for the average film thickness is not judged to be satisfied, temperatures of the process gases heated by the preheating units, by which temperatures the conditions for the in-plane uniformity, the inter-plane uniformity, and the average film thickness can be satisfied, are respectively calculated, the temperatures of the process gases heated by the preheating units, which are included in the process conditions stored in the process-condition storage units are respectively varied, into the respective calculated temperatures of the process gases, and the temperatures of the process gases are regulated such that the objects to be processed are processed under the varied process conditions.

The present invention is the method for regulating a temperature of a thermal processing apparatus wherein: the process chamber is divided into a plurality of zones; and the heating unit is capable of individually setting temperatures of the respective zones in the process chamber.

The present invention is a computer program executable in a computer to perform a method for regulating a temperature of a thermal processing apparatus including: a process chamber capable of accommodating a plurality of objects to be processed; a heating unit configured to heat an inside of the process chamber; a plurality of process-gas supply units configured to supply process gases into the process chamber; a plurality of preheating units respectively disposed on the process-gas supply units, the preheating units being configured to heat the process gases supplied from the process-gas supply units, before the process gases are supplied into the process chamber; a process-condition storage unit that stores process conditions in accordance with a process content, the process conditions including a temperature of the process chamber heated by the heating unit, respective temperatures of the process gases heated by the preheating units, an in-plane uniformity of the process, and an inter-plane uniformity of the process; and a processing unit configured to process the objects to be processed under the process conditions stored in the process-condition storage unit; the method comprising: a judging step in which it is judged whether a result of the process performed by the processing unit satisfies the in-plane uniformity of the process and the inter-plane uniformity of the process; and a process-gas temperature regulating step in which, when at least one of the in-plane uniformity and the inter-plane uniformity is not judged to be satisfied, respective temperatures of the process gases heated by the preheating units, by which temperatures the in-plane uniformity and the inter-plane uniformity can be satisfied are calculated, the temperatures of the process gases heated by the preheating units, which are included in the process conditions stored in the process-condition storage unit, are respectively varied into the calculated temperatures of the process gases, and the temperatures of the process gases are regulated such that the objects to be processed are processed under the varied process conditions.

According to the present invention, a temperature can be easily regulated.

BRIEF DESCRIPTION OF THE DRAWINGS

FIG. 4 is a view showing a relationship between a temperature of a preheating part and a film thickness of each semiconductor wafer.

FIGS. 6(a), 6(b), and 6(c) show an example of a process recipe.

FIG. 7 is a view showing an example of film-thickness data of measured $SiO_2$ films.

FIGS. 10(a) and 10(b) are views for explaining a temperature regulation of the preheating part.

FIG. 11 is a view for explaining a temperature variation amount of a heater.

FIG. 14 is a view showing a relationship between a temperature of a preheating part and a film thickness of each semiconductor wafer.

FIGS. 16(a), 16(b), and 16(c) show an example of a process recipe.

FIG. 17 is a view showing an example of film-thickness data of measured $SiO_2$ films.

FIG. 18 is a view showing an example of the converted film-thickness data.

MODE FOR CARRYING OUT THE INVENTION

First Embodiment

Given hereinafter is an example to describe a first embodiment where a thermal processing apparatus, a method for regulating a temperature of a thermal processing apparatus, and a program of the present invention are applied to a batch-type vertical thermal processing apparatus shown in FIG. 1. In this embodiment, an $SiO_2$ film is formed on a semiconductor wafer, by using as a film deposition gas dichlorosilane ($SiH_2Cl_2$) and dinitrogen monoxide ($N_2O$), for example.

Figure 1:
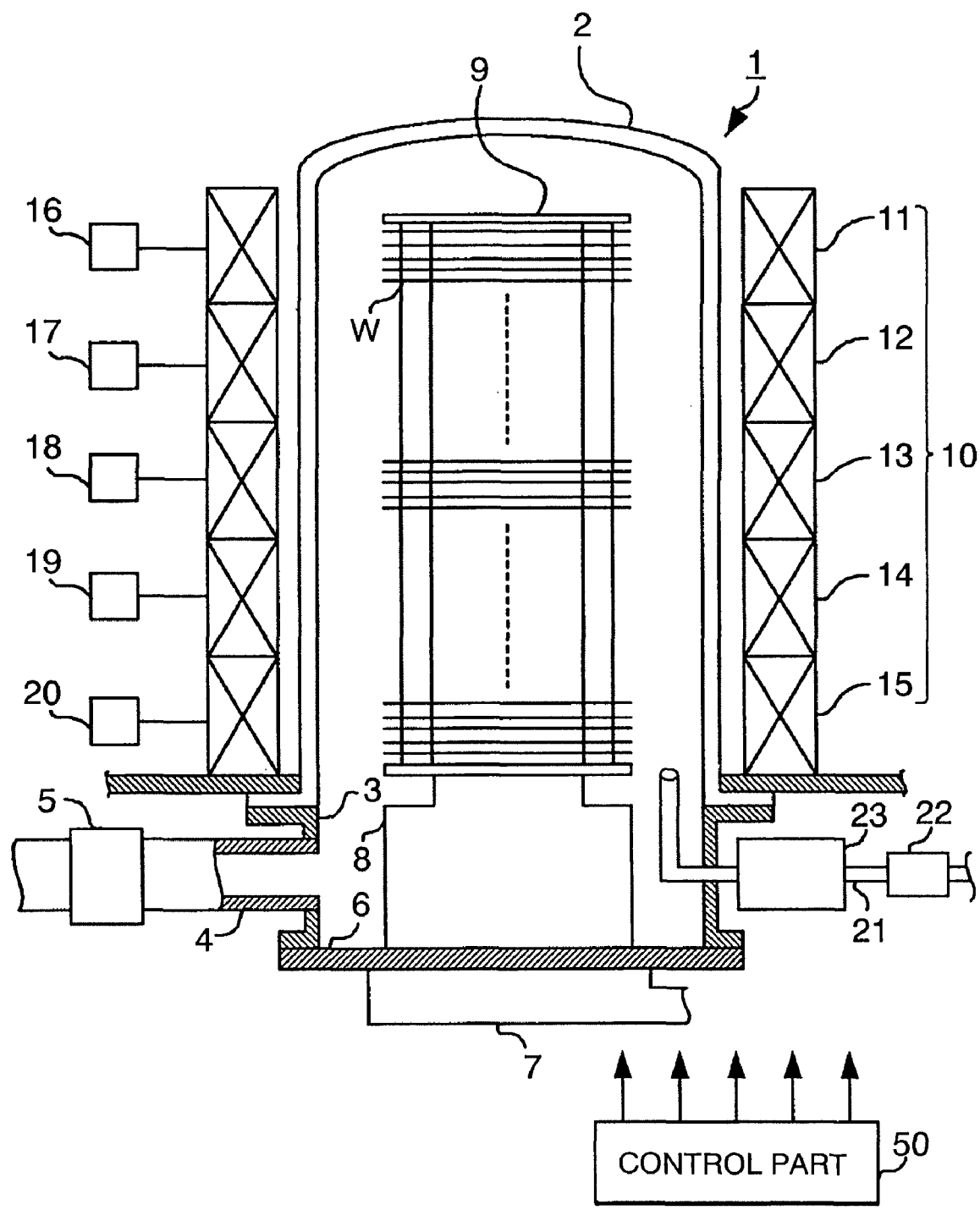
FIG. 1 is a view showing a structure of a first embodiment of a thermal processing apparatus according to the present invention.

As shown in FIG. 1, a thermal processing apparatus 1 in this embodiment includes a substantially cylindrical reaction tube (process chamber) 2 having a ceiling. The reaction tube 2 is arranged such that a longitudinal direction thereof is oriented in a vertical direction. The reaction tube 2 is made of a material, e.g., quartz, which has an excellent thermal resistance and an excellent corrosive resistance.

Disposed below the reaction tube 2 is a substantially cylindrical manifold 3. An upper end of the manifold 3 and a lower end of the reaction tube 2 are air-tightly joined to each other. An exhaust pipe 4 through which a gas in the reaction tube 2 is discharged is air-tightly connected to the manifold 3. The exhaust pipe 4 is provided with a pressure regulating part 5 composed of, e.g., a valve and a vacuum pump, whereby the inside of the reaction tube 2 can be regulated to a desired pressure (vacuum degree).

A lid member 6 is disposed below the manifold 3 (reaction tube 2). The lid member 6 can be moved upward and downward by a boat elevator 7. When the lid member 6 is elevated by the boat elevator 7, a lower side (furnace opening part) of the manifold 3 (reaction tube 2) is closed, and when the lid member 6 is lowered by the boat elevator 7, a lower side (furnace opening part) of the reaction tube 2 is opened.

A wafer boat 9 is disposed above the lid member 6 through a heat-retention tube (heat-insulation member) 8. The wafer boat 9 is a wafer holder that can contain (hold) an object to be processed such as a semiconductor wafer W. In this embodiment, the wafer boat 9 can contain a plurality of, e.g., 150 semiconductor wafers W with predetermined vertical intervals therebetween. By elevating the lid member 6 on which the wafer boat 9 containing semiconductor wafers W is placed, the semiconductor wafers W can be loaded into the reaction tube 2.

Figure 3:
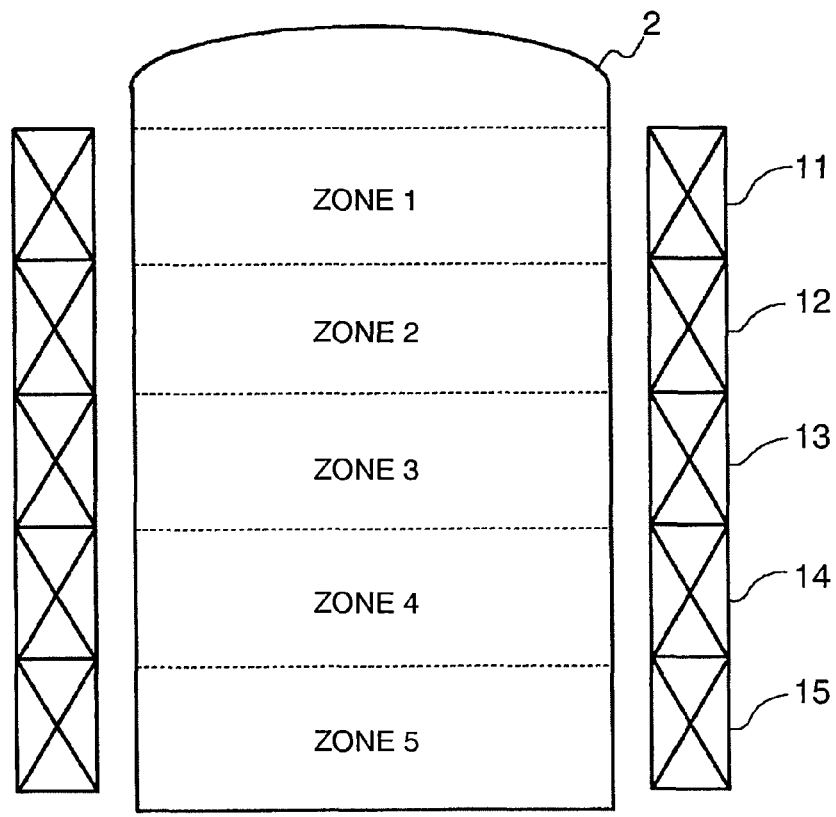
FIG. 3 is a view showing zones in a reaction tube.

A heating part 10 formed of, e.g., a heating resistor, is disposed around the reaction tube 2 to surround the same. Due to the heating part 10, the inside of the reaction tube 2 can be heated to a predetermined temperature, so that the semiconductor wafers W are heated to a predetermined temperature. The heating part 10 is composed of five heaters 11 to 15 which are vertically arranged. Connected to the heaters 11 to 15 are electric controllers 16 to 20, respectively. By independently supplying electric powers to the respective electric controllers 16 to 20, the heaters 11 to 15 can be independently heated to desired temperatures. Namely, the inside of the reaction tube 2 is divided by the heaters 11 to 15 into five zones, which are described hereafter with reference to FIG. 3.

The manifold 3 is provided with a process-gas supply pipe 21 for supplying a process gas into the reaction tube 2. The process-gas supply pipe 21 is equipped with a flow-rate regulating part 22 and a preheating part 23. The flow-rate regulating part 22 is formed of, e.g., a mass flow controller (MFC) for regulating a flow rate of a process gas. The preheating part 23 is formed by, for example, winding a heater around an outside of a quartz vessel connected to the process-gas supply pipe 21. Thus, a process gas supplied from the process-gas supply pipe 21 is supplied into the reaction tube 2, with a flow rate thereof being regulated to a desired flow rate by the flow-rate regulating part 22, and a temperature thereof being heated to a desired temperature by the preheating part 23.

Figure 2:
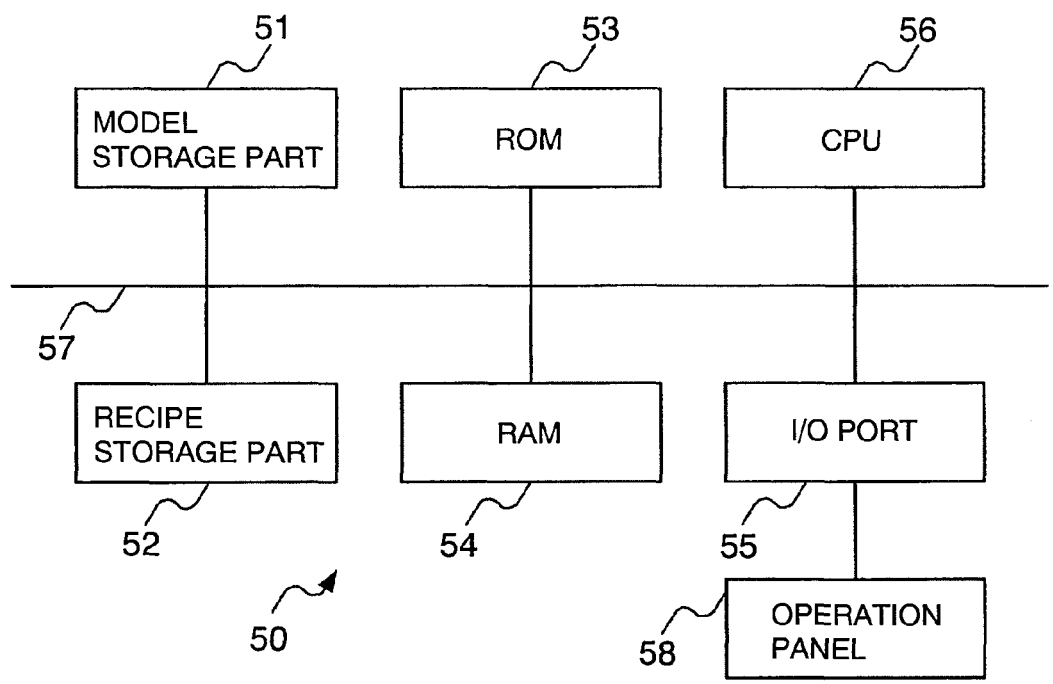
FIG. 2 is a view showing a structural example of a control part shown in FIG. 1.

The thermal processing apparatus 1 includes a control part (controller) 50 for controlling process parameters such as a gas flow rate, a pressure, and a temperature of a process atmosphere in the reaction tube 2. The control part 50 outputs control signals to the flow-rate regulating part 22, the pressure regulating part 5, and the electric controllers 16 to 20. FIG. 2 shows a structure of the control part 50.

As shown in FIG. 2, the control part 50 is composed of a model storage part 51, a recipe storage part 52, a ROM 53, a RAM 54, an I/O port 55, a CPU 56, and a bus 57 connecting these parts to each other.

The model storage part 51 stores models required for calculating temperatures of the heaters 11 to 15 (corresponding to temperatures of the inside within the reaction tube 2 heated by the heaters 11 to 15) and a temperature of the preheating part 23 (corresponding to a temperature of the process gas heated by the preheating part 23). Specifically, the model storage part 51 stores a model showing a relationship between temperatures of the heaters 11 to 15 and film thicknesses of semiconductor wafers W, and a model showing a relationship between a temperature of the preheating part 23 and a film thickness of each semiconductor wafer W. Details of these models are described herebelow.

The recipe storage part 52 stores process recipes for determining a control procedure in accordance with a type of a film deposition process performed by the thermal processing apparatus. The process recipe is a recipe that is prepared for each process actually performed by a user. The process recipe defines variations in temperatures of the respective parts, a variation in pressure in the reaction tube 2, a timing for starting a gas supply, a timing for stopping the gas supply, and a supply rate of the gas, through the process starting from when semiconductor wafers W are loaded into the reaction tube 2 up to when the processed semiconductor wafers W are unloaded therefrom. In addition, the process recipe stores constraint conditions for an in-plane uniformity of each deposited film (film-thickness difference in a single plane), an inter-plane uniformity of deposited films (film-thickness difference between planes), and an average film thickness.

The ROM 53 is a recording medium formed of an EEPROM, a flash memory, or a hard disc, which stores an operation program of the CPU 56.

The RAM 54 functions as a working area of the CPU 56.

The I/O port 55 supplies, to the CPU 56, measurement signals regarding a temperature, a pressure, and a gas flow rate, and outputs control signals outputted by the CPU 56 to the respective parts (the electric controllers 16 to 20, the flow-rate regulating parts 22, and the pressure regulating part 5). Connected to the I/O port 55 is an operation panel 58 by which an operator operates the thermal processing apparatus 1.

The CPU (Central Processing Unit) 56, which constitutes a central part of the control part 50, executes the operation program stored in the ROM 53, and controls an operation of the thermal processing apparatus 1, based on instructions from the operation panel 58, in accordance with the process recipe stored in the recipe storage part 52.

The CPU 56 calculates temperatures of the heaters 11 to 15 and a temperature of the preheating part 23, based on the models stored in the model storage part 51, film-thickness data of semiconductor wafers W, and a required film thickness of the semiconductor wafer W. Then, the CPU 56 outputs control signals to the electric controllers 16 to 20 so as to regulate temperatures of the heaters 11 to 15 and a temperature of the preheating part 23, such that the temperatures thereof become the calculated temperatures. The CPU 56 updates the temperatures of the heaters 11 to 15 and the preheating part 23, which are stored in the corresponding recipe storage part 52, to the calculated temperatures.

The bus 57 transmits information among the respective parts.

Next, the models stored in the model storage part 51 are described. As described above, the model storage part 51 stores the model showing a relationship between temperatures of the heaters 11 to 15 and film thicknesses of the semiconductor wafers W, and the model showing a relationship between a temperature of the preheating part 23 and a film thickness of each semiconductor wafer W.

In this embodiment, there is stored, as the model showing a relationship between temperatures of the heaters 11 to 15 and film thicknesses of the semiconductor wafers W, a relational expression (the following Expression (2)) showing a relationship between temperatures of the heaters 11 to 15 and film thicknesses of the semiconductor wafers W. The relational expression is an expression which shows how much a film thickness of the semiconductor wafer W is varied, when a temperature of each of the heaters is varied by 1° C.

Generally, a reaction speed (film-deposition speed) in a film deposition process such as a CVD (Chemical Vapor Deposition) process is represented by the following Expression (1).

$$V = A \times \exp^{-Ea/kT} \quad \text{Expression (1)}$$

in which V is a reaction speed (film deposition speed), A is a frequency factor, Ea is an activation energy, k is a Boltzmann's constant, and T is an absolute temperature. The activation energy Ea is determined by a type of the film deposition process, and is 1.8 (eV) in the reaction of this example.

By partially differentiating the Expression (1) by the temperature T, the following Expression (2) is obtained.

$$d\,\text{Thickness}/dt = \text{thickness} \times Ea/kT^2 \quad \text{Expression (2)}$$

In the Expression (2), the left-hand side {d Thickness/dt} shows a relationship between temperatures and film thicknesses, namely, a film-thickness variation amount when a temperature of each of the heaters 11 to 15 is varied by 1° C. Based on the Expression (2), temperatures of the heaters 11 to 15 for achieving desired film thicknesses of the semiconductor wafers W can be calculated.

The model showing a relationship between a temperature of the preheating part 23 and a film thickness of each semiconductor wafer W is a model showing how much the film thickness of each semiconductor wafer W is varied when a temperature of the preheating part 23 is varied by 1° C. FIG. 4 shows an example of the model.

Generally, when a temperature of the preheating part 23 is raised, a film tends to be easily deposited. This tendency has an effect on a film thickness of a film formed at a center of the semiconductor wafer W and a film thickness of the film formed at an edge thereof. In addition, placed positions (zones) of the semiconductor wafers W have an effect on the film thicknesses of the films formed on the semiconductor wafers W. Thus, as shown in FIG. 4, this model shows film-thickness variation amounts of a film when a temperature of the preheating part 23 is raised by 1° C. from 400° C., 500° C., 600° C., and 700° C. In more detail, this model shows the film-thickness variation amounts of the film formed at a center (Ctr) of the semiconductor wafer W and at an edge (Edge) which is distant from the center by 150 mm. Further, this model shows the film-thickness variation amounts of the film formed on the semiconductor wafer W received in each of the zones 1 to 5 (slot). In a case where a temperature of the preheating part 23 is a temperature other than the temperatures written in this model, such as 550° C., the model can be used by obtaining a weighted average of the film-thickness variation data.

In order to create this model, films were formed while varying a temperature of the preheating part 23, with conditions other than the temperature of the preheating part 23 being fixed. Film thicknesses of each of the films were measured at a center of the wafer and at an edge thereof, so that a film-thickness variation amount per 1° C. was calculated. For example, in a case where a temperature of the preheating part 23 was 700° C., films were formed with temperatures of the preheating part 23 being set at 695° C. and 705° C. Then, film thicknesses of the films were measured at centers thereof and at edges thereof. By dividing a difference between the film thicknesses (film-thickness variation amount) by 10 (° C.), a film-thickness variation amount per 1° C. was calculated.

In order to regulate temperatures of the heaters 11 to 15 and the preheating part 23, it is sufficient for the model showing a relationship between a temperature of the preheating part 23 and a film thickness of each semiconductor wafer W and a model showing a relationship between temperatures of heaters 11 to 15 and film thicknesses of the semiconductor wafers W to show how much a film thickness of each semiconductor wafer W is varied when a temperature of each of the heaters 11 to 15 and the preheating parts 23 is varied by 1° C., and various models other than the aforementioned models can be employed.

In addition, it can be considered that default values of these models may not be optimum ones depending on process conditions and apparatus conditions. Thus, an extended Kalman filter may be added to a software for calculating temperatures to impart thereto a learning function, such that the software learns the film thickness–temperature models. As a learning function by the Kalman filter, there may be employed a method disclosed in U.S. Pat. No. 5,991,525, for example.

Figure 5:
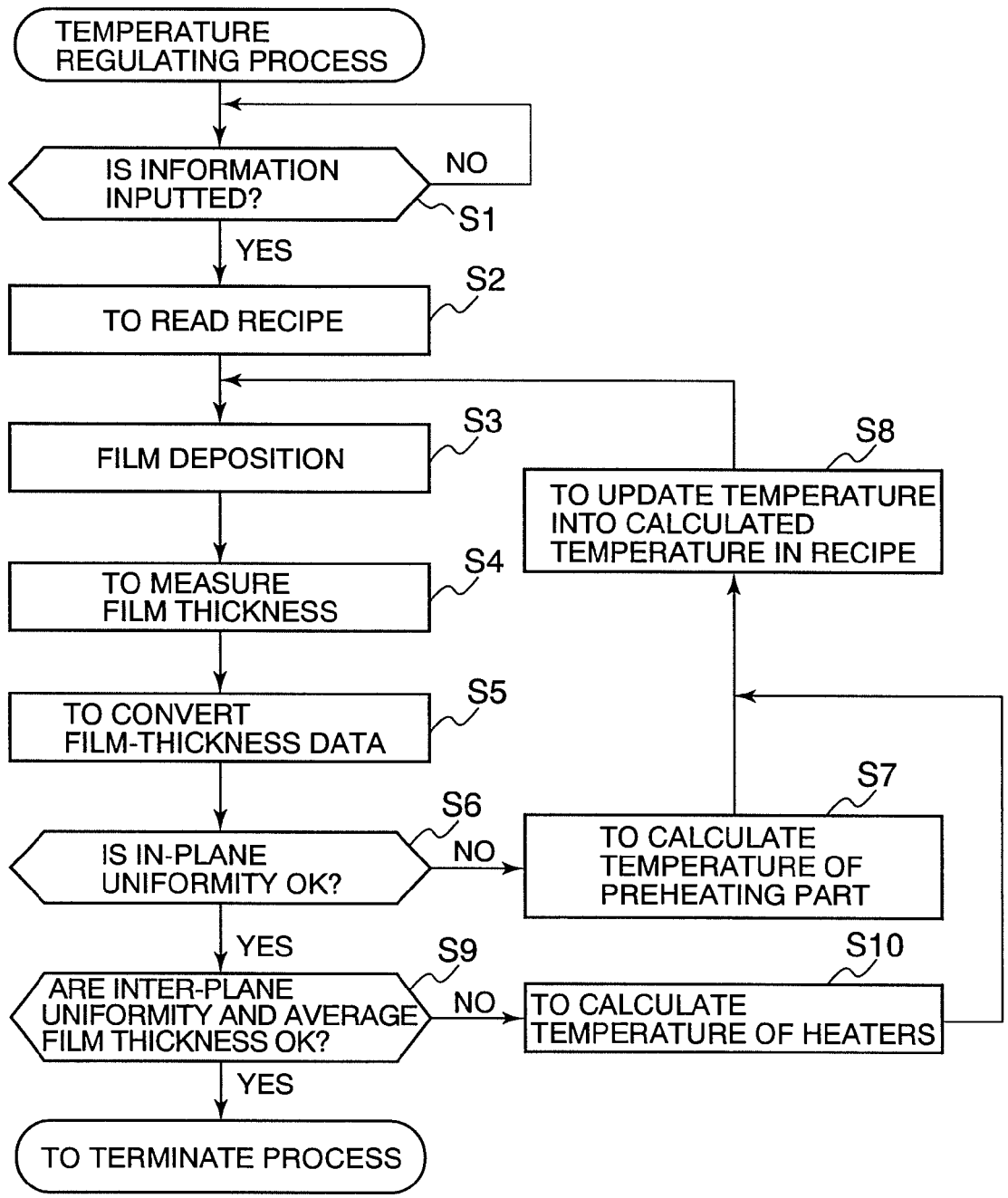
FIG. 5 is a flowchart for explaining a temperature regulating process.

Next, there is described a method for regulating temperatures of the heaters 11 to 15 and a temperature of the preheating part 23 (temperature regulating process) with the use of the thermal processing apparatus 1 as structured above. The temperature regulating process may be performed in a set-up stage which is performed before a film deposition process, or may be performed simultaneously with the film deposition process. FIG. 5 is a flowchart for explaining the temperature regulating process.

An operator operates the operation panel 58 so as to select a type of the process, in this example, a film deposition process (DCS-HTO) for depositing an $SiO_2$ film that is made of dichlorosilane and dinitrogen monoxide ($N_2O$), and to input a target film thickness of the $SiO_2$ film.

If there is a constraint condition in the film deposition process, the operator may operate the operation panel 58 so as to input the constraint condition. The constraint condition may be, for example, a process period (e.g., between 20 and 30 minutes), a temperature range of the preheating part 23 and/or the heaters 11 to 15 (e.g., between 600° C. and 800° C.), an intended in-plane uniformity (film-thickness difference in a single plane), an intended intra-film uniformity (film-thickness difference between planes), an average film thickness, and so on.

At first, the control part 50 (CPU 56) judges whether a type of the process has been inputted or not (step S1). When the CPU 56 judges that required information has been inputted (step S1; Yes), the CPU 56 reads out a process recipe corresponding to the inputted type of the process from the recipe storage part 52 (step S2). As shown in FIG. 6, the process recipe stores general process conditions for depositing an $SiO_2$ film by using dichlorosilane and dinitrogne monoxide.

Then, the CPU 56 lowers the boat elevator 7 (lid member 6) so that the wafer boat 9, in which semiconductor wafers W (monitor wafers) are received at least in the respective zones 1 to 5, is placed on the lid member 6. Following thereto, the CPU 56 elevates the boat elevator 7 (lid member 6) so as to load the wafer boat 9 (monitor wafers) into the reaction tube 2. Then, based on the recipe read from the recipe storage part 52, the CPU 56 controls the electric controllers 16 to 20, the flow-rate regulating part 22, and the pressure regulating part 5, such that $SiO_2$ films are deposited on the monitor wafers (step S3).

After the film deposition process has been terminated, the CPU 56 lowers the boat elevator 7 (lid member 6) so as to unload the monitor wafers on which the $SiO_2$ films have been deposited. The CPU 56 then transfers the unloaded monitor wafers to, e.g., a measuring apparatus, not shown, and film thicknesses of the $SiO_2$ films deposited on the monitor wafers are measured by the measuring apparatus (step S4). After the measuring apparatus has measured the film thicknesses of the $SiO_2$ films formed on the respective monitor wafers, the measuring apparatus sends the film-thickness data of the measured $SiO_2$ films to the thermal processing apparatus 1 (CPU 56).

Upon receipt of the film-thickness data of the measured $SiO_2$ films, the CPU 56 converts the film-thickness data (step S5). This is because, as shown in FIG. 7, the film-thickness data of each measured $SiO_2$ film show the film thicknesses measured at as many as nine points, i.e., at one center point and at eight edge points of the semiconductor wafer W. In this embodiment, the film-thickness data of the measured $SiO_2$ film are converted to film-thickness data showing two film thicknesses, i.e., one center thickness and one edge thickness of the semiconductor wafer W.

Figures 8, 9:
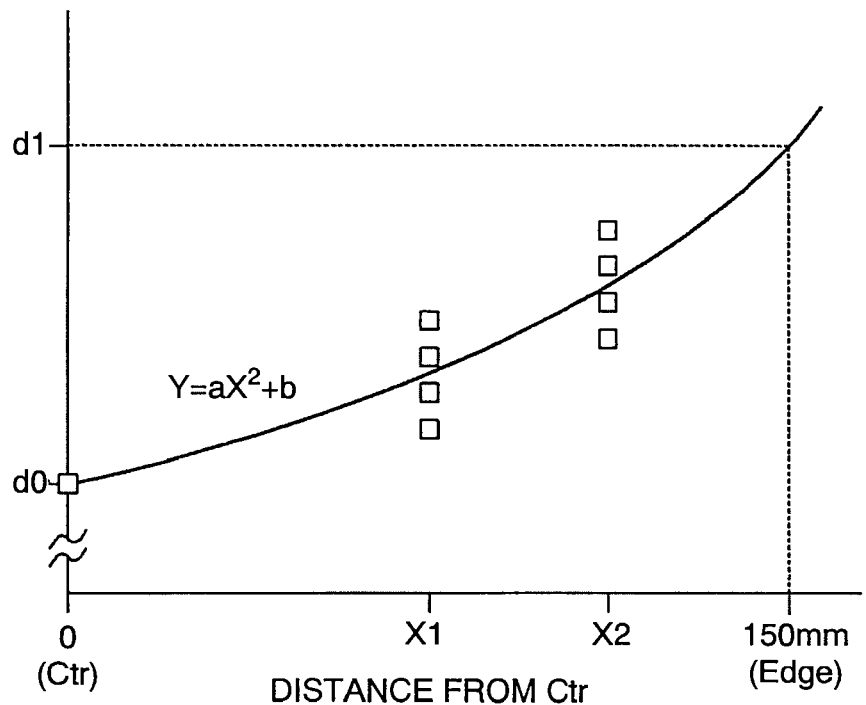
FIG. 8 is a view for explaining conversion of the film-thickness data.
FIG. 9 is a view showing an example of the converted film-thickness data.

Specifically, a film-thickness distribution curve in a plane of the wafer is calculated from the obtained film-thickness data by a least squares method. Namely, a film thickness Y of the film formed on the semiconductor wafer W is represented as a quadratic function ($Y=aX^2+b$) of a distance X from the center of the semiconductor wafer W, and an approximate curve shown in FIG. 8 is calculated by obtaining the (a) and the (b) from the received film-thickness data.

Subsequently, a center film thickness d0 (Ctr) of the semiconductor wafer W and an edge film thickness d1 (Edge) which is distant from the center of the semiconductor wafer W by 150 mm are calculated from the calculated approximate curve for each slot. Thus, the film-thickness data shown in FIG. 7 are converted into the film-thickness data, which is shown in FIG. 9, showing only two film thicknesses, i.e., one center thickness (Ctr) and one edge thickness (Edge).

Then, the CPU 56 judges whether the in-plane uniformity stored in the read-out recipe is satisfied or not (whether the in-plane uniformity is OK or not) (step S6). To be specific, the CPU 56 judges whether a film thickness difference between the edge (Edge) film thickness and the center (Ctr) film thickness of the converted film-thickness data is smaller than the in-plane film thickness difference stored in the recipe. When the CPU 56 judges that the in-plane uniformity is not satisfied (step S6; No), the CPU 56 calculates (regulates) a temperature of the preheating part 23 (step S7).

A temperature of the preheating part 23 is calculated by utilizing an optimizing algorithm, such as a linear programming or a quadratic programming, such that the film thickness difference can become smaller than the in-plane uniformity stored in the read-out recipe, and that the calculated temperature can minimize deviations of the film thicknesses at all the points under these conditions. Specifically, as shown in FIG. 10, there is calculated a temperature of the preheating part 23 which can make smaller the in-plane film thickness differences of all the slots than the in-plane film thickness difference stored in the read-out recipe, and can make smallest the in-plane film thickness difference of each slot. That is to say, when a temperature of the preheating part 23 is calculated, it is not necessary to consider a film thickness of each slot, an inter-plane uniformity, and an average film thickness, which are described below. For example, a film thickness of each slot may be considerably thinned. As described below, these can be improved by regulating temperatures of the heaters 11 to 15. Following thereto, the CPU 56 updates the temperature of the preheating part 23 stored in the read-out recipe to the calculated temperature (step S8), and returns to the step S3.

When the CPU 56 judges that the in-plane uniformity is satisfied (step S6; Yes), the CPU 56 then judges whether the inter-plane uniformity and the average film thickness, which are stored in the read-out recipe, are satisfied or not (whether the inter-plane uniformity and the average film thickness are OK or not) (step S9). When the CPU 56 judges that the inter-plane uniformity and the average film thickness are not satisfied (step S9; No), the CPU 56 calculates (regulates) temperatures of the heaters 11 to 15.

Figure 12:
FIG. 12 is a view for explaining a temperature regulation of the heater.

Temperatures of the heaters 11 to 15 are calculated by obtaining a difference between the current film thickness and the target film thickness, and by calculating a temperature variation amount of a certain heater for making up the difference, with the use of the Expression (2) stored in the model storage part 51. When the temperature of 780° C., the film thickness of 5 nm, and the activation energy of 1.8 eV, which are the process conditions in this example, are substituted to the Expression (2) stored in the model storage part 51, a film-thickness variation amount when temperatures of the heaters 11 to 15 are varied by 1° C. is 0.1 (nm/° C.). For example, in the case of the Slot 115, as shown in FIG. 11, the Ctr thickness is 2.57 nm, the Edge thickness is 3.07 nm, and the average thickness thereof is 2.82 nm. Since the difference between the average thickness of 2.82 nm and the target thickness of 5 nm is 2.18 nm, a temperature variation amount of the heater 15 is obtained by dividing 2.18 (nm) by 0.1 (nm/° C.), i.e., 21.8° C. Thus, as shown in FIG. 12, by raising the temperature of the heater 15 up to 751.8° C., which is higher than the current temperature of the heater 15 by 21.8° C., there can be obtained a film having a film thickness of 5 nm.

Following the similar procedure, temperature variation amounts of the respective heaters 11 to 14 are obtained, so as to calculate temperatures of the heaters 11 to 14. Subsequently, as shown in FIG. 12, the CPU 56 updates the temperatures of the respective heaters 11 to 15 stored in the read-out recipe to the calculated temperatures (step S8), and returns to the step S3. When the CPU 56 judges that the inter-plane uniformity and the average film thickness are satisfied (step S9; Yes), the CPU 56 terminates the process.

As described above, according to this embodiment, temperatures of the heaters 11 to 15 and a temperature of the preheating part 23 can be regulated so as to achieve a film thickness uniformity of $SiO_2$ films deposited on the surfaces of the semiconductor wafers W, only by inputting the type of the process and the target film thickness of the film. Thus, even an operator who is inexperienced in a thermal processing apparatus and a thermal process can easily regulate a temperature.

In addition, according to this embodiment, the in-plane uniformity of an $SiO_2$ film formed on the semiconductor wafer W is regulated by the temperature of the preheating part 23, and the inter-plane uniformity and the film thickness (average film thickness) are regulated by the temperatures of the heaters 11 to 15. Namely, since the temperatures of the heaters 11 to 15 and the temperature of the preheating part 23 are not simultaneously regulated, disturbance can be reduced, which leads to a relatively stable temperature regulation.

The present invention is not limited to the aforementioned embodiment, and various modifications and applications of the present invention are possible. Herebelow, there are described other embodiments which are applicable to the present invention.

In the above embodiment, the present invention has been described, giving as an example the case in which, after a temperature of the preheating part 23 has been regulated, temperatures of the heaters 11 to 15 are regulated. However, the present invention can be realized as long as the temperature regulation of the preheating part 23 and the temperature regulation of the heaters 11 to 15 are separately performed. For example, it is possible to regulate a temperature of the preheating part 23 after temperatures of the heaters 11 to 15 have been regulated.

In the above embodiment, the present invention has been described, giving as an example the case in which the film-thickness data of the measured $SiO_2$ films are converted. However, it is possible to regulate temperatures of the preheating part 23 and the heaters 11 to 15, without converting the film-thickness data of the measured $SiO_2$ films.

In the above embodiment, the present invention has been described, giving as an example the case in which the thermal processing apparatus for forming an $SiO_2$ film. However, the type of the process is optional, and the present invention can be applied to various batch-type thermal processing apparatuses such as a CVD apparatus and an oxidation apparatus for forming another type of film.

In the above embodiment, the present invention has been described, giving as an example the case in which film thicknesses of films formed by a film deposition process are regulated. However, the present invention can be used to make appropriate various process results, such as a diffusion concentration or a diffusion depth in an impurity diffusion process, an etching rate, a reflectance, an imbedding property, and a step coverage.

In the above embodiment, the present invention has been described, giving as an example the batch-type thermal processing apparatus of a singe tube structure. However, the present invention can be applied to a bath-type vertical thermal processing apparatus of a dual tube structure in which the reaction tube 2 is composed of an inner tube and an outer tube. Further, the number of heaters (the number of zones) and the number of monitor wafers picked out from the respective zones can be optionally set. Furthermore, not limited to a process of a semiconductor wafer, the present invention can be applied to a process of, e.g., an FPD substrate, a glass substrate, and a PDP substrate.

The control part 50 in this embodiment of the present invention may be realized not by a system for exclusive use, but by a general computer system. For example, by installing the program for executing the aforementioned process in a multi-purpose computer from a recording medium (e.g., flexible disc, CD-ROM) storing the program, the controller 50 for performing the aforementioned process can be constituted.

Means for supplying the program is optional. The program can be supplied through a predetermined recording medium. Alternatively, the program may be supplied through, e.g., a communication line, a communication network, and a communication system. In this case, for example, the program may be displayed on a bulletin board system (BBS) of a communication network, and the program may be provided by superposing the program on a carrier through the network. The aforementioned process can be performed by activating the thus provided program and executing the same under control of an OS, similarly to other application programs.

Second Embodiment

Figure 13:
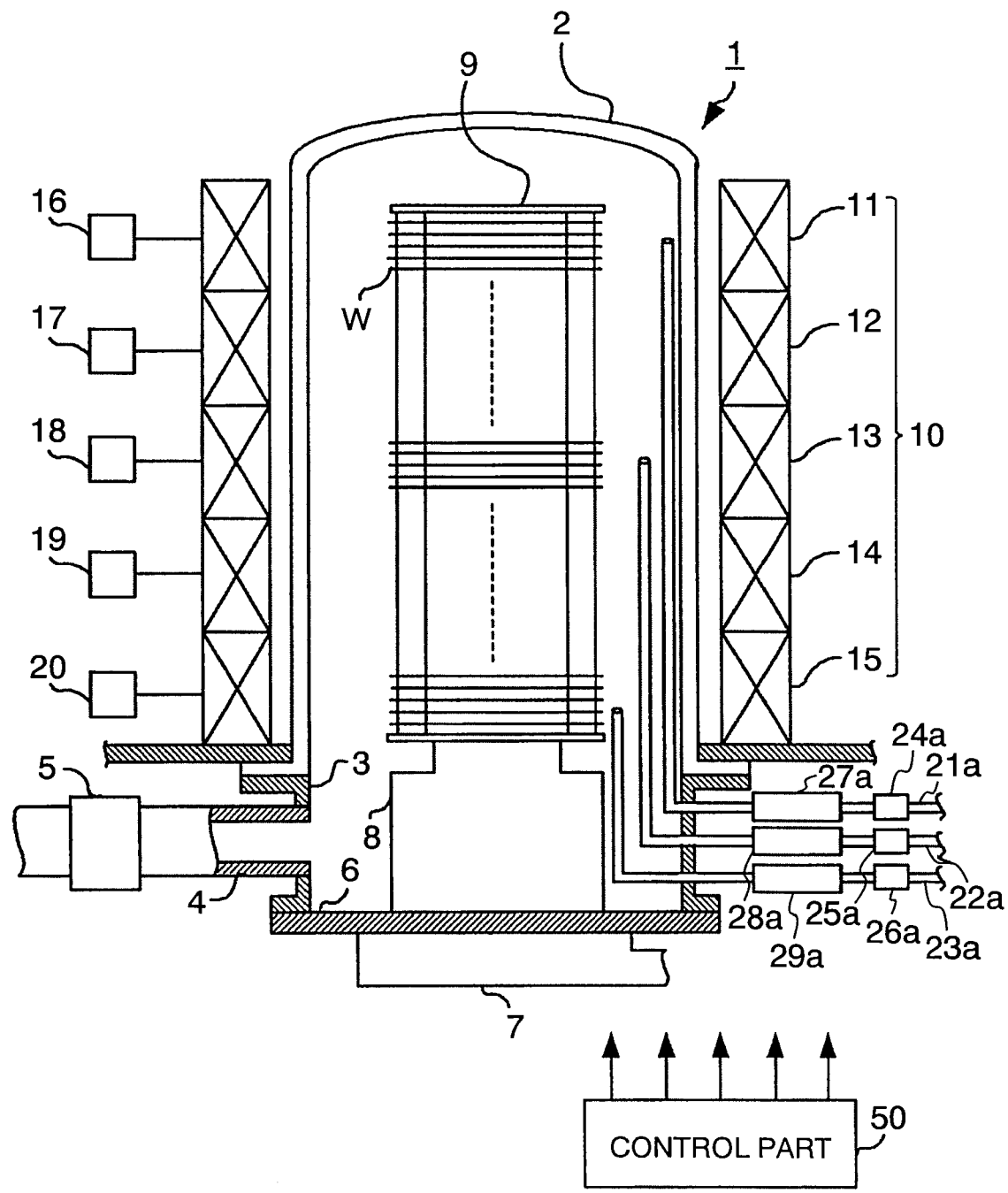
FIG. 13 is a view showing a structure of a second embodiment of a thermal processing apparatus according to the present invention.

Given hereafter is an example to describe a second embodiment where a thermal processing apparatus, a method for regulating a temperature of a thermal processing apparatus, and a program of the present invention are applied to a batch-type vertical thermal processing apparatus shown in FIG. 13. In this embodiment, an $SiO_2$ film is formed on a semiconductor wafer, by using as a film deposition gas dichlorosilane (SiH$_2$Cl$_2$) and dinitrogne monoxide (N$_2$O), for example.

As shown in FIG. 13, a thermal processing apparatus 1 in this embodiment includes a substantially cylindrical reaction tube (process chamber) 2 having a ceiling. The reaction tube 2 is arranged such that a longitudinal direction thereof is oriented in a vertical direction. The reaction tube 2 is made of a material, e.g., quartz, which has an excellent thermal resistance and an excellent corrosive resistance.

Disposed below the reaction tube 2 is a substantially cylindrical manifold 3. An upper end of the manifold 3 and a lower end of the reaction tube 2 are air-tightly joined to each other. An exhaust pipe 4 through which a gas in the reaction tube 2 is discharged is air-tightly connected to the manifold 3. The exhaust pipe 4 is provided with a pressure regulating part 5 composed of, e.g., a valve and a vacuum pump, whereby the inside of the reaction tube 2 can be regulated to a desired pressure (vacuum degree).

A lid member 6 is disposed below the manifold 3 (reaction tube 2). The lid member 6 can be moved upward and downward by a boat elevator 7. When the lid member 6 is elevated by the boat elevator 7, a lower side (furnace opening part) of the manifold 3 (reaction tube 2) is closed, and when the lid member 6 is lowered by the boat elevator 7, a lower side (furnace opening part) of the reaction tube 2 is opened.

A wafer boat 9 is disposed above the lid member 6 through a heat-retention tube (heat-insulation member) 8. The wafer boat 9 is a wafer holder that can contain (hold) an object to be processed such as a semiconductor wafer W. In this embodiment, the wafer boat 9 can contain a plurality of, e.g., 150 semiconductor wafers W with predetermined vertical intervals therebetween. By elevating the lid member 6 on which the wafer boat 9 containing semiconductor wafers W is placed, the semiconductor wafers W can be loaded into the reaction tube 2.

A heating part 10 formed of, e.g., a heating resistor, is disposed around the reaction tube 2 to surround the same. Due to the heating part 10, the inside of the reaction tube 2 can be heated to a predetermined temperature, so that the semiconductor wafers W are heated to a predetermined temperature. The heating part 10 is composed of fiber heaters 11 to 15 which are vertically arranged. Connected to the heaters 11 to 15 are electric controllers 16 to 20, respectively. By independently supplying electric powers to the respective electric controllers 16 to 20, the heaters 11 to 15 can be independently heated to desired temperatures. Namely, the inside of the reaction tube 2 is divided by the heaters 11 to 15 into five zones, which are described hereafter with reference to FIG. 3.

The manifold 3 is provided with a plurality of process-gas supply pipes for supplying process gases into the reaction tube 2. In this embodiment, the manifold 3 is provided with three process-gas supply pipes 21a to 23a. The process-gas supply pipe 21a is extended from a side part of the manifold 3 to a part near to a top portion (TOP) of the wafer boat 9. The process-gas supply pipe 22a is extended from the side part of the manifold 3 to a part near to a center portion (CTR) of the wafer boat 9. The process-gas supply pipe 23a is extended from the side part of the manifold 3 to a part near to a bottom portion (BTM) of the wafer boat 9.

The process-gas supply pipes 21a to 23a are equipped with flow-rate regulating part 24a to 26a, and preheating parts 27a to 29a, respectively. Each of the flow-rate regulating parts 24a to 26a is formed of, e.g., a mass flow controller (MFC) for regulating a flow rate of a process gas flowing each of the process-gas supply pipes 21a to 23a. Each of the preheating parts 27a to 29a is formed by, for example, winding a heater around an outside of a quartz vessel which is connected to each of the process-gas supply pipes 21a to 23a. Connected to the respective preheating parts 27a to 29a are electric controllers, not shown. By independently supplying electric powers to the respective electric controllers, the preheating parts 27a to 29a can be independently heated to desired temperature. Thus, process gases supplied from the process-gas supply pipes 21a to 23a are supplied into the reaction tube 2, with flow rates thereof being regulated to desired flow rates by the flow-rate regulating parts 24a to 26a, respectively, and temperatures thereof being heated to desired temperatures by the preheating parts 27a to 29a, respectively.

The thermal processing apparatus 1 includes a control part (controller. 50 for controlling process parameters such as a gas flow rate, a pressure, and a temperature of a process atmosphere in the reaction tube 2. The control part 50 outputs control signals to the flow-rate regulating parts 24a to 26a, the electric controllers of the preheating parts 27a to 29a, the pressure regulating part 5, and the electric controllers 16 to 20 of the heaters 11 to 15. FIG. 2 shows a structure of the control part 50.

As shown in FIG. 2, the control part 50 is composed of a ode storage part 51, a recipe storage part 52, a ROM 53, a RAM 54, an I/O port 55, a CPU 56, and a bus connecting these parts to each other.

The model storage part 51 stores a model required for calculating temperatures of the preheating parts 27a to 29a. Specifically, the model storage part 51 stores a model showing a relationship between temperatures of the preheating parts 27a to 29a and a film thickness of each semiconductor wafer W. Details of this model are described herebelow.

The recipe storage part 52 stores process recipes for determining a control procedure in accordance with a type of a film deposition process performed by the thermal processing apparatus 1. The process recipe is a recipe that is prepared for each process actually performed by a user. The process recipe defines variations in temperatures of the respective parts, a variation in pressure in the reaction tube 2, a timing for starting a gas supply, a timing for stopping the gas supply, and a supply rate of the gas, through the process starting from when semiconductor wafers W are loaded into the reaction tube 2 up to when the processed semiconductor wafers W are unloaded therefrom. In addition, the process recipe stores constraint conditions for an in-lane uniformity of each film deposited by the film deposition process (film-thickness difference in a single plane), an intra-film uniformity of deposited films (film-thickness difference between planes), and an average film thickness.

The ROM 53 is a recording medium formed of an EEPROM, a flash memory, or a hard disc, which stores an operation program of the CPU 56.

The RM 54 functions as a working area of the CPU 56.

The I/O port 55 supplies, to the CPU 56, measurement signals regarding a temperature, a pressure, and a gas flow rate, and outputs control signals outputted by the CPU 56 to the respective parts (the pressure regulating part 5, the electric controllers 16 to 20 of the heaters 11 to 15, the flow-rate regulating parts 24a to 26a, the electric controllers of the preheating parts 27a to 29a, and so on). Connected to the I/O port 55 is an operation panel 58 by which an operator operates the thermal processing apparatus 1.

The CPU (Central Processing Unit) 56, which constitutes a central part of the control part 50, executes the operation program stored in the ROM 53, and controls an operation of the thermal processing apparatus 1, based on an instruction from the operation panel 58, in accordance with the process recipe stored in the recipe storage part 52.

The CPU 56 calculates temperatures of the preheating parts 27a to 29a based on the model stored in the model storage part 51, film-thickness data of the semiconductor wafers W, and a required film thickness of the semiconductor wafer W. Then, the CPU 56 outputs control signals to the electric controllers and the like so as to regulate temperatures thereof, such that temperatures of the preheating parts 27a to 29a become the calculated temperatures. The CPU 56 updates the temperatures of the preheating parts 27a to 29a stored in the corresponding recipe storage part 52 to the calculated temperatures.

The bus 57 transmits information among the respective parts.

Next, the model stored in the mode storage part 51 is described. As described above, the model storage part 51 stores the model showing a relationship between temperatures of the preheating parts 27a to 29a and a film thickness of each semiconductor wafer W. The model showing a relationship between temperatures of the preheating parts 27a to 29a and a film thickness of each semiconductor wafer W is a model showing how much a film thickness of each semiconductor wafer W is varied when a temperature of each of the preheating parts 27a to 29a is varied by 1° C. FIG. 14 shows an example of the model.

Generally, when temperatures of the preheating parts 27a to 29a are raised, a film tends to be easily deposited. This tendency has an effect on a film thickness of a film formed at a center of the semiconductor wafer W and a film thickness of the film formed at an edge thereof. In addition, placed positions (zones) of the semiconductor wafers W have an effect on the film thicknesses of the films formed on the semiconductor wafers W. Thus, as shown in FIG. 14, this model shows film-thickness variation amounts of a film when a temperature of each of the preheating part 27a to 29a is raised by 1° C. from 400° C., 500° C., 600° C., and 700° C. In more detail, this model shows the film-thickness variation amounts of the film formed at a center (Ctr) of the semiconductor wafer W and at an edge (Edge) which is distant from the center by 150 mm. Further, this model shows the film-thickness variation amounts of the film formed on the semiconductor wafer W received in each of the zones 1 to 5 (slot). In a case where temperatures of the preheating parts 27a to 29a are temperatures other than the temperatures written in this model, such as 550° C., the model can be used by obtaining a weighted average of the film-thickness variation data.

In order to create this model, films were formed while varying a temperature of one of the preheating parts 27a to 29a, with conditions other than the temperatures of the preheating parts 27a to 29a being fixed. Film thicknesses of each of the films were measured at a center of the wafer and at an edge thereof, so that a film-thickness variation amount per 1° C. was calculated. For example, in a case where a temperature of the preheating part 29a is 700° C., films were formed with temperatures of the preheating part 29a being set at 695° C. and 705° C. Then, film thicknesses of the films were measured at centers thereof and at edges thereof. By dividing a difference between the film thicknesses (film-thickness variation amount) by 10(° C.), a film-thickness variation amount per 1° C. was calculated.

In order to regulate temperatures of the preheating parts 27a to 29a, it is sufficient for the model showing a relationship between temperatures of the preheating parts 27a to 29a and a film thickness of each semiconductor wafer W to show how much a film thickness of each semiconductor wafer W is varied when a temperature of each of the preheating parts 27a to 29a is varied by 1° C., and various models other than the aforementioned model can be employed.

In addition, it can be considered that default values of these models may not be optimum ones depending on process conditions and apparatus conditions. Thus, an extended Kalman filter may be added to a software for calculating temperatures to impart thereto a learning function, such that the software learns the film thickness–temperature model. As a learning function by the Kalman filter, there may be employed a method disclosed in U.S. Pat. No. 5,991,525, for example.

Figure 15:
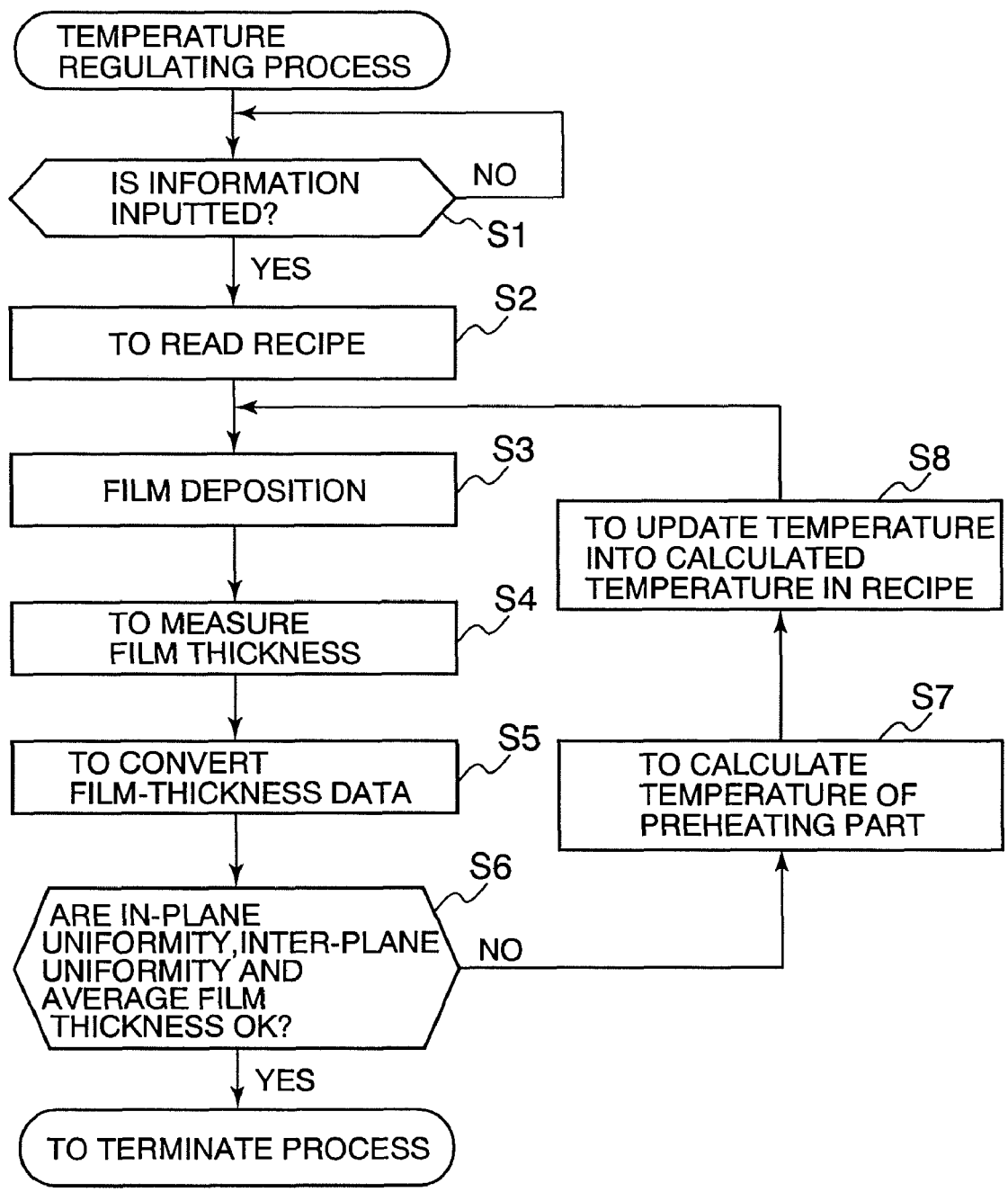
FIG. 15 is a flowchart for explaining a temperature regulating process.

Next, there is described a method for regulating temperatures of the preheating parts 27a to 29a (temperature regulating process) with the use of the thermal processing apparatus 1 as structured above. The temperature regulating process may be performed in a set-up stage which is performed before a film deposition process, or may be performed simultaneously with the film deposition process. FIG. 15 is a flowchart for explaining the temperature regulating process.

An operator operates the operation panel 58 so as to select a type of the process, in this example, a film deposition process (DCS-HTO) for depositing an $SiO_2$ film that is made of dichlorosilane and dinitrogen monoxide ($N_2O$), and to input a target film thickness of the $SiO_2$ film.

If there is a constraint condition in the film deposition process, the operator may operate the operation panel 58 so as to input the constraint condition. The constraint condition may be, for example, a process period (e.g., between 20 and 30 minutes), a temperature range of the preheating parts 27a to 29a (e.g., between 600° C. and 800° C.), an intended in-plane uniformity (film-thickness difference in a single plane), an intended intra-film uniformity (film-thickness difference between planes), an average film thickness, and so on.

At first, the control part 50 (CPU 56) judges whether a type of the process has been inputted or not (step S1). When the CPU 56 judges that required information has been inputted (step S1; Yes), the CPU 56 reads out a process recipe corresponding to the inputted type of the process from the recipe storage part 52 (step S2). As shown in FIG. 16, the process recipe stores general process conditions for depositing an $SiO_2$ film by using dichlorosilane and dinitrogne monoxide.

Then, the CPU 56 lowers the boat elevator 7 (lid member 6) so that the wafer boat 9, in which semiconductor wafers W (monitor wafers) are received at least in the respective zones 1 to 5, is placed on the lid member 6. Following thereto, the CPU 56 elevates the boat elevator 7 (lid member 6) so as to load the wafer boat 9 (monitor wafers) into the reaction tube 2. Then, based on the recipe read from the recipe storage part 52, the CPU 56 controls the pressure regulating part 5, the electric controllers 16 to 20 of the heaters 11 to 15, the flow-rate regulating parts 24a to 26a, and the electric controllers of the preheating parts 27a to 29a, such that $SiO_2$ films are deposited on the monitor wafers (step S3).

After the film deposition process has been terminated, the CPU 56 lowers the boat elevator 7 (lid member 6) so as to unload the monitor wafers on which the $SiO_2$ films have been deposited. The CPU 56 then transfers the unloaded monitor wafers to, e.g., a measuring apparatus, not shown, and film thicknesses of the $SiO_2$ films deposited on the monitor wafers are measured by the measuring apparatus (step S4). After the measuring apparatus has measured the film thicknesses of the $SiO_2$ films formed on the respective monitor wafers, the measuring apparatus sends the film-thickness data of the measured $SiO_2$ films to the thermal processing apparatus 1 (CPU 56).

Upon receipt of the film-thickness data of the measured $SiO_2$ films, the CPU 56 converts the film-thickness data (step S5). This is because, as shown in FIG. 17, the film-thickness data of each measured $SiO_2$ film show the film thicknesses measured at as many as nine points, i.e., at one center point and at eight edge points of the semiconductor wafer W. In this embodiment, the film-thickness data of the measured $SiO_2$ film are converted to film-thickness data showing two film thicknesses, i.e., one center thickness and one edge thickness of the semiconductor wafer W.

Specifically, a film-thickness distribution curve in a plane of the wafer is calculated from the obtained film-thickness data by a least squares method, so as to convert the film-thickness data into film-thickness data showing the center thickness and the edge thickness of each semiconductor wafer W. Namely, a film thickness Y of the film formed on the semiconductor wafer W is represented as a quadratic function ($Y=aX^2+b$) of a distance X from the center of the semiconductor wafer W, and an approximate curve shown in FIG. 8 is calculated by obtaining the (a) and the (b) from the received film-thickness data. Subsequently, a center film thickness d0 (Ctr) of the semiconductor wafer W and an edge film thickness d1 (Edge), which is distant from the center of the semiconductor wafer W by 150 mm, are calculated from the calculated approximate curve for each slot. Thus, the film-thickness data shown in FIG. 17 are converted into the film-thickness data, which is shown in FIG. 18, showing only two film thicknesses i.e., one center film thickness (Ctr) and one edge film thickness (Edge).

Then, the CPU 56 judges whether the converted film-thickness data satisfy the constraint conditions for the in-plane uniformity, the inter-plane uniformity, and the average film thickness, which are stored in the read-out recipe (step S6). When the in-plane uniformity is judged to be satisfied or not, for example, the CPU 56 judges whether a film thickness difference between the edge thickness (Edge) and the center thickness (Ctr) of the converted film-thickness data is smaller than the in-plane film thickness difference stored in the recipe. When the inter-plane uniformity is judged to be satisfied or not, the CPU 56 judges whether an average film thickness of the zone 1 (slot 11) and the zone 5 (slot 115) of the converted film-thickness data is smaller than the intra-film thickness difference stored in the recipe. When the average film thickness is judged to be satisfied or not, the CPU 56 judges whether an average film thickness of the converted film-thickness data satisfies the conditions of the average film thickness stored in the recipe.

When the CPU 56 judges that any of the constraint conditions for the in-plane uniformity, the inter-plane uniformity, and the average film thickness is not satisfied (step S6; No), the CPU 56 calculates (regulates) temperatures of the preheating part 27a to 29a (step S7).

Figure 19:
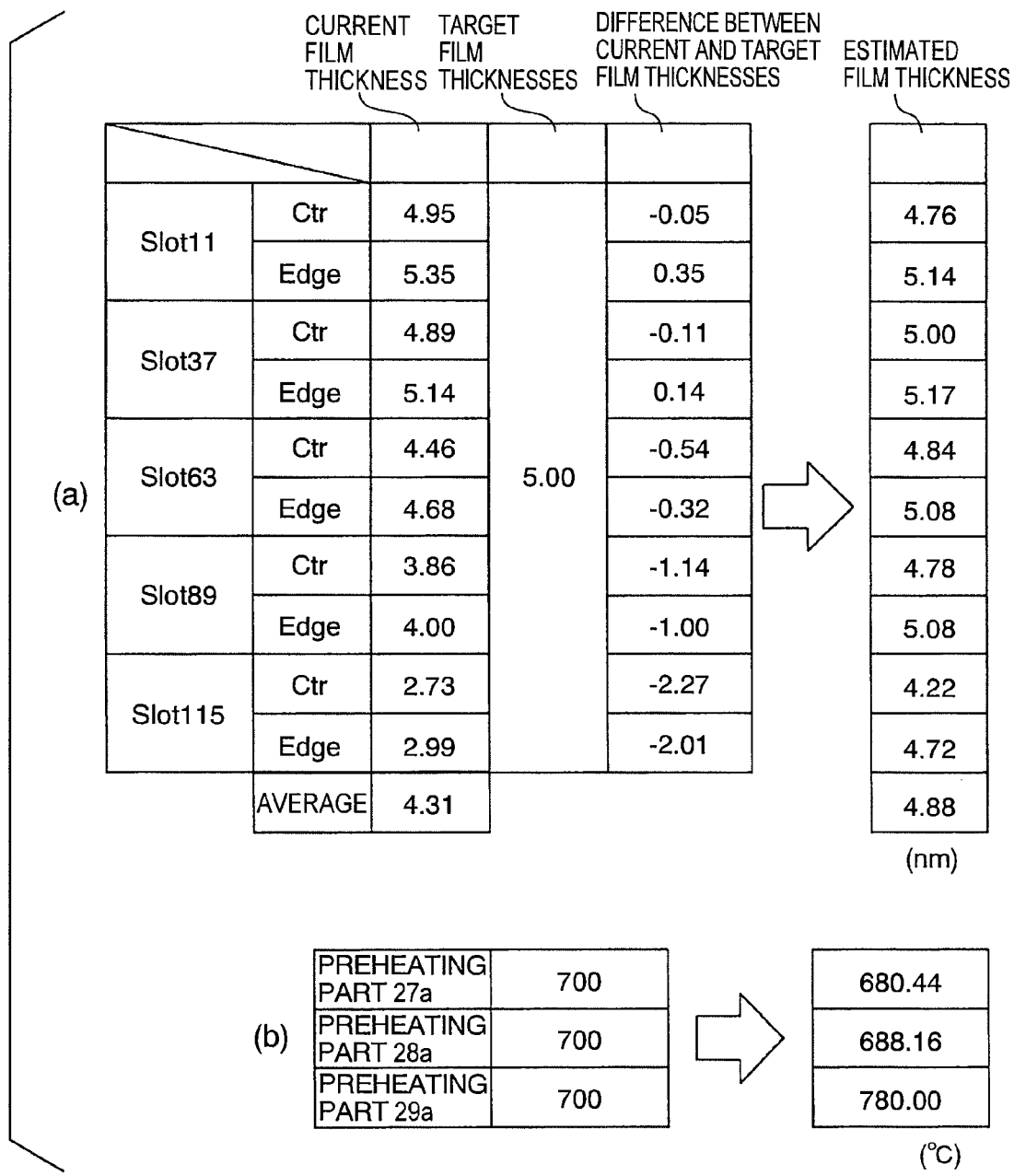
FIGS. 19(a) and 19(b) are views for explaining a temperature regulation of the preheating part.

Temperatures of the preheating parts 27a to 29a are calculated by utilizing an optimizing algorithm, such as a linear programming or a quadratic programming, such that the calculated temperatures can satisfy the constraint conditions for the in-plane uniformity, the inter-plane uniformity, and the average film thickness, and that the calculated temperatures can minimize deviations of the film thicknesses at all the points under these conditions. For example, as shown in FIG. 19, by obtaining differences between a center thickness and an edge thickness of each slot and target thicknesses thereof obtained, temperatures of the respective preheating parts 27a to 29a are calculated by means of the optimizing algorithm, based on the model shown in FIG. 14 showing a relationship between temperatures of the preheating parts 27a to 29a and a film thickness of each semiconductor wafer W, such that the temperatures of the respective preheating parts 27a to 29a can minimize the differences between the current film thicknesses and the target film thicknesses, while satisfying constraint conditions for the in-plane uniformity, the inter-plane uniformity, and the averaged film thickness.

After that, the CPU 56 updates the temperatures of the preheating parts 27a to 29a stored in the read-out recipe to the calculated temperature (step S8), and returns to the step S3. When the CPU judges that the constraint conditions for the in-plane uniformity, the inter-plane uniformity, and the average film thickness are satisfied (step S6; Yes), the CPU 56 terminates the process.

As described above, according to this embodiment, temperatures of the preheating parts 27a to 29a can be regulated so as to achieve a film thickness uniformity of $SiO_2$ films deposited on the surfaces of the semiconductor wafers W, only by inputting the type of the process and the target film thickness of the film. Thus, even an operator who is inexperienced in a thermal processing apparatus and a thermal process can easily regulate a temperature.

The present invention is not limited to the aforementioned embodiment, and various modifications and applications of the present invention are possible. Herebelow, there are described other embodiments which are applicable to the present invention.

In the above embodiment, the present invention has been described, giving as an example the case in which temperatures of the preheating parts 27a to 29a are regulated when any of the constraint conditions for the in-plane uniformity, the inter-plane uniformity, and the average film thickness is not satisfied. However, it is possible to regulate temperatures of the preheating parts 27a to 29a, when one of constraint conditions for the in-plane uniformity and the inter-plane uniformity is not satisfied. In this case, it is possible to achieve a film thickness uniformity of an $SiO_2$ film deposited on a surface of a semiconductor wafer W by varying a process period so as to regulate the average film thickness.

In the above embodiment, the present invention has been described, giving as an example in which the number of the preheating parts 27a to 29a disposed in the thermal processing apparatus 1 is three. However, the number of the preheating parts may be optionally set, e.g., two or four or more. Further, the number of heaters (the number of zones) and the number of monitor wafers picked out from the respective zones can be optionally set.

In the above embodiment, the present invention has been described, giving as an example the case in which the film-thickness data of the measured $SiO_2$ films are converted. However, it is possible to regulate temperatures of the preheating parts 27a to 29a, without converting the film-thickness data of the measured $SiO_2$ films.

In the above embodiment, the present invention has been described, giving as an example the case in which an $SiO_2$ film is deposited by using dichlorosilane and dinitrogen monoxide. However, the present invention can be applied to a case when an SiN film is deposited by using dichlorosilane and ammonia ($NH_3$).

In the above embodiment, the present invention has been described, giving as an example the case in which the thermal processing apparatus for forming an $SiO_2$ film. However, the type of the process is optional, and the present invention can be applied to various batch-type thermal processing apparatuses such as a CVD apparatus and an oxidation apparatus for forming another type of film.

In the above embodiment, the present invention has been described, giving as an example the case in which film thicknesses of films formed by a film deposition process are regulated. However, the present invention can be used to make appropriate various process results, such as a diffusion concentration or a diffusion depth in an impurity diffusion process, an etching rate, a reflectance, an imbedding property, and a step coverage.

In the above embodiment, the present invention has been described, giving as an example the batch-type thermal processing apparatus of a singe tube structure. However, the present invention can be applied to a bath-type vertical thermal processing apparatus of a dual tube structure in which the reaction tube 2 is composed of an inner tube and an outer tube. Furthermore, not limited to a process of a semiconductor wafer, the present invention can be applied to a process of, e.g., an FPD substrate, a glass substrate, and a PDP substrate.

The control part 50 in this embodiment of the present invention may be realized not by a system for exclusive use, but by a general computer system. For example, by installing the program for executing the aforementioned process in a multi-purpose computer from a recording medium (e.g., flexible disc, CD-ROM) storing the program, the controller 50 for performing the aforementioned process can be constituted.

Means for supplying the program is optional. The program can be supplied through a predetermined recording medium. Alternatively, the program may be supplied through, e.g., a communication line, a communication network, and a communication system. In this case, for example, the program may be displayed on a bulletin board system (BBS) of a communication network, and the program may be provided by superposing the program on a carrier through the network. The aforementioned process can be performed by activating the thus provided program and executing the same under control of an OS, similarly to other application programs.

The present invention is useful for regulating a temperature of a thermal processing apparatus.

The invention claimed is:

1. A method for regulating a temperature of a thermal processing apparatus during performance of a film deposition therein, the apparatus including:
   a process chamber capable of accommodating a plurality of objects to be processed;
   a heating unit configured to heat an inside of the process chamber;
   a process-gas supply unit configured to supply a process gas into the process chamber;
   a preheating unit configured to heat a process gas supplied from the process-gas supply unit, before the process gas is supplied into the process chamber;
   a process-condition storage unit that stores process conditions in accordance with a process content, the process conditions including a temperature of the process chamber heated by the heating unit, a temperature of the process gas heated by the preheating unit, an in-plane uniformity of the process, and an inter-plane uniformity of the process; and
   a processing unit configured to process the objects to be processed under the process conditions stored in the process-condition storage unit,
   the method comprising, simultaneously with the film deposition, performing temperature regulating by:
      a process-gas temperature regulating step, including:
         a step in which it is judged whether a result of the process performed by the processing unit satisfies the in-plane uniformity of a process stored in the process-condition storage unit; and
         a step in which, when the in-plane uniformity is judged to be not satisfied, a temperature of the process gas by which the in-plane uniformity can be satisfied is calculated, and the temperature of the process gas is varied to the calculated temperature,
         and the temperature of the process gas is regulated, such that the objects to be processed are processed under process conditions in which the temperature of the process gas is the calculated temperature; and a process-chamber temperature regulating step, including:
         a step in which it is judged whether a result of the process performed by the processing unit satisfies the inter-plane uniformity of a process stored in the process-condition storage unit; and
         a step in which, when the inter-plane uniformity is judged to be not satisfied, a temperature of the process chamber by which the inter-plane uniformity can be satisfied is calculated, and the temperature of the process chamber is regulated such that the objects to be processed are processed under process conditions in which the temperature of the process chamber has been varied to the calculated temperature,
   one of the process-gas temperature regulating step and the process-chamber temperature regulating step is performed after the other of the process-gas temperature regulating step and the process-chamber temperature regulating step has been performed so as to avoid overlapping of the process-gas temperature regulating step and the process-chamber temperature regulating step.

2. The method for regulating a temperature of a thermal processing apparatus according to claim 1, wherein after the process-gas temperature regulating step has been performed, the process-chamber temperature regulating step is performed.

3. The method for regulating a temperature of a thermal processing apparatus according to claim 1, wherein the process content is the film deposition process.

4. The method for regulating a temperature of a thermal processing apparatus according to claim 1, wherein:
   the process chamber is divided into a plurality of zones; and
   the heating unit is capable of individually setting temperatures of the respective zones in the process chamber.

5. A method for regulating a temperature of a thermal processing apparatus including:
   a process chamber capable of accommodating a plurality of objects to be processed;
   a heating unit configured to heat an inside of the process chamber;
   a plurality of process-gas supply units configured to supply process gases into the process chamber;
   a plurality of preheating units respectively disposed on the process-gas supply units, the preheating units being configured to heat the process gases supplied from the process-gas supply units, before the process gases are supplied into the process chamber;
   a process-condition storage unit that stores process conditions in accordance with a process content, the process conditions including a temperature of the process chamber heated by the heating unit, respective temperatures of the process gases heated by the preheating units, an in-plane uniformity of the process, and an inter-plane uniformity of the process; and
   a processing unit configured to process the objects to be processed under the process conditions stored in the process-condition storage unit;
the method comprising:
   a judging step in which it is judged whether a result of the process performed by the processing unit satisfies the in-plane uniformity and the inter-plane uniformity of a process stored in the process-condition storage unit; and a process-gas temperature regulating step in which, when at least one of the in-plane uniformity and the inter-plane uniformity is judged to be not satisfied, respective temperatures of the process gases by which the in-plane uniformity and the inter-plane uniformity can be satisfied are calculated, and the temperatures of the process gases are respectively varied to the calculated temperatures by the preheating units to thereby achieve both the in-plane uniformity and the inter-plane uniformity of a process wherein the method further comprises a film deposition process, the process-gas temperature regulating step is a step in a temperature regulating process, and the temperature regulating process is performed simultaneously with the film deposition process.

6. The method for regulating a temperature of a thermal processing apparatus according to claim 5, wherein the process content is a film deposition process.

7. The method for regulating a temperature of a thermal processing apparatus according to claim 5, wherein:

the process conditions stored in the process-condition storage unit include an average film thickness of deposited films on the objects to be processed;

in the judging step, it is further judged whether the result of the process performed by the processing unit satisfies the condition for the average film thickness;

in the process-gas temperature regulating step, when the condition for the average film thickness is judged to be not satisfied, temperatures of the process gases by which the conditions for the in-plane uniformity, the inter-plane uniformity, and the average film thickness can be satisfied are respectively calculated, the temperatures of the process gases are respectively varied to the respective calculated temperatures, and the temperatures of the process gases are regulated such that the objects to be processed are processed under process conditions in which the temperatures of the process gases are the respective calculated temperatures.

8. The method for regulating a temperature of a thermal processing apparatus according to claim 5, wherein:

the process chamber is divided into a plurality of zones; and the heating unit is capable of individually setting temperatures of the respective zones in the process chamber.

* * * * *